(12) United States Patent
Wu et al.

(10) Patent No.: US 6,518,164 B1
(45) Date of Patent: Feb. 11, 2003

(54) ETCHING PROCESS FOR FORMING THE TRENCH WITH HIGH ASPECT RATIO

(75) Inventors: Yann-Pyng Wu, Miao-Li (TW); Yueh-Feng Ho, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/996,955

(22) Filed: Nov. 30, 2001

(51) Int. Cl.[7] .......................................... H01L 21/4763
(52) U.S. Cl. ...................... 438/618; 438/638; 438/737
(58) Field of Search ................................. 438/618, 637, 438/638, 640, 713, 714, 737, 738

(56) References Cited

U.S. PATENT DOCUMENTS

| | | | |
|---|---|---|---|
| 4,352,724 A | * 10/1982 | Sugishima et al. | 204/192 |
| 4,836,887 A | * 6/1989 | Daubenspeck et al. | 156/643 |
| 5,286,344 A | * 2/1994 | Blalock et al. | 156/657 |
| 5,814,563 A | * 9/1998 | Ding et al. | 438/714 |
| 6,140,168 A | * 10/2000 | Tan et al. | 438/197 |
| 2002/0000422 A1 | * 1/2002 | Donohoe et al. | 216/64 |

FOREIGN PATENT DOCUMENTS

| | | | | |
|---|---|---|---|---|
| JP | 2001-127038 | * | 5/2001 | ........... H01L/21/28 |
| JP | 2001-127039 | * | 5/2001 | ....... H01L/21/3065 |

* cited by examiner

*Primary Examiner*—Olik Chaudhuri
*Assistant Examiner*—David S Blum (57) ABSTRACT

First of all, a semiconductor substrate is provided, the semiconductor substrate has a dielectric layer thereon. Then a photoresist layer is formed and defined on the dielectric layer. Next, an etching process is performed by the photoresist layer as an etched mask to form a trench in the dielectric layer, wherein the etchant of the etching process comprises a mixing gas with a $C_4F_6$ gas or a $CH_2F_2$ gas, such as $C_4F_6/CH_2F_2/Ar/O_2$ or $C_4F_6/CH_2F_2/Ar/O_2/CF_4$ or $C_4F_6/CH_2F_2/Ar/O_2/C_2F_6$, accordingly, the etching capability of the etchant and the etching selectivity between the dielectric layer and the photoresist layer can be raised. Finally, the photoresist layer is removed to form the contact window or the via hole with high accurate critical dimension.

8 Claims, 7 Drawing Sheets

ETCHING PROCESS FOR FORMING THE TRENCH WITH HIGH ASPECT RATIO

BACKGROUND OF THE INVENTION

1. Field of the Invention

The present invention-relates generally to an etching process for forming a trench of the semiconductor, and in particular to an etching process for forming a contact window or a via hole with high aspect ratio.

2. Description of the Prior Art

As semiconductor devices, such as Metal-Oxide-Semiconductor devices, become highly integrated the area occupied by the device shrinks, as well as the design rule. With advances in the semiconductor technology, the dimensions of the integrated circuit (IC) devices have shrunk to the deep sub-micron range. When the semiconductor device continuously shrinks to the deep sub-micron region, some problems described below are incurred due to the scaling down process.

Dynamic random access memory (DRAM) is applied broadly in the field of integrated circuits devices, and more importantly, in the electronics industry. These devices provide a means of temporary data storage, and they are used in many digital systems, such as computers. Dynamic random access memory (DRAM) with higher capacitance is necessary for the development of the industry. As a result, dynamic random access memory with higher density and capacitance are of great interest and are developed by the related industry. Because intense competition in the Dynamic random access memory (DRAM) marketplace, it is essential that manufacturers reduce the cost of their Dynamic random access memory (DRAM) circuits. To reduce costs and to meet customer expectations for decreasing access times and increasing IC memory size, manufacturers must continually reduce the size of features on the integrated circuit wafer. Such reductions in feature size have brought about much advancement in the art. However, the small geometry presents problems in the predictable manufacture of Dynamic random access memory (DRAM) circuits. How to keep the quality as the size of the device is reduced is now a task for the industry to overcome.

When semiconductor devices of integrated circuit (IC) become highly integrated, the surface of the chips can be not supplied with enough area to make the interconnects. For matching the requirement of interconnects increase when Complementary Metal Oxide Semiconductor (CMOS) devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which is used to separate from each of the interconnects. A conducting wire which connects between the upper and the lower metal layers is called the via plug in semiconductor industry. In general, if an opening which forms in the dielectric layer exposure to devices of the substrate in the interconnects, is called a via. Therefore, the upper and he lower metal layers are electrically connected each other by way of the metal plug in the connect hole or via hole.

Figure 1A:
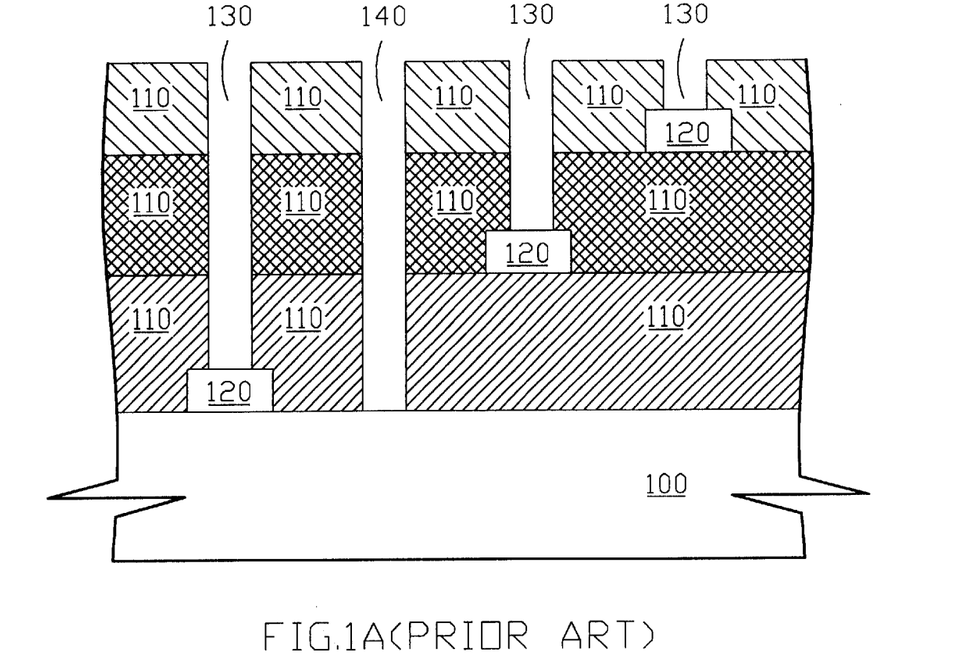
FIG. 1A shows cross-sectional views illustrative of the stack structure of the dynamic random access memory in accordance with the conventional process.

In general, in the stacked structure of the dynamic random access memory (DRAM), there is a plurality of dielectric layers 110 with multi-levels on the semiconductor substrate 100, a plurality of gates 120 are individually located in the plurality of dielectric layers 110 with multi-levels, a plurality of contact windows 130 are individually located on the plurality of gates 120, and a plurality of via holes 140 are located on the semiconductor substrate 100, as shown in FIG. 1A. Because of the levels where the plurality of dielectric layers 110 are formed are different, the deepness for forming the plurality of contact windows 130 are different from each other, and the deepness for forming the plurality of via holes 140 are more deeper. In the semiconductor process, the ratio (H/W) of the trench width and the trench deepness is called "Aspect Ratio". If the aspect ratio is raised, the trench deepness will be increased or the trench width will be decreased, so that the etching process for forming the trench will be more difficult. For the deep sub-micron technology, the design rule has been scaling down, so that the devices must have the contact windows or via holes with high aspect ratio. Especially, in the dynamic random access memory (DRAM) etching process for forming the contact windows or via holes with high aspect ratio are hard to perform. Furthermore, when the aspect ratio of the contact windows is smaller and smaller, the etching capability of the via holes with high aspect ratio is very important below the process of the dynamic random access memory.

Figure 1B:
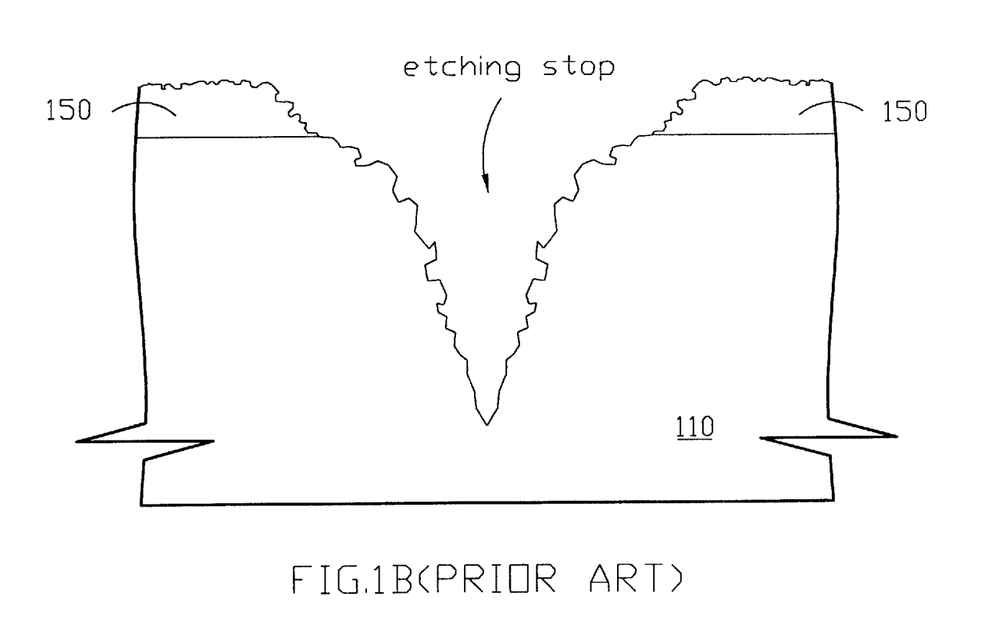
FIG. 1B shows cross-sectional views illustrative of the etching stop effect in accordance with the conventional etching process for forming the trench.
Figure 1C:
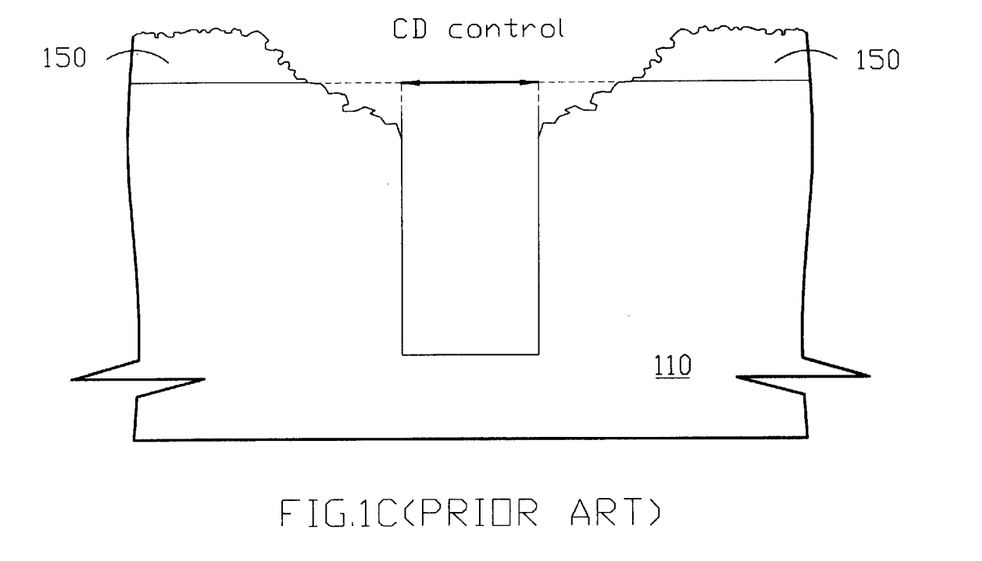
FIG. 1C shows cross-sectional views illustrative of the remainder of the photoresist layer that is not enough in accordance with the conventional etching process for forming the trench.
Figure 1D:
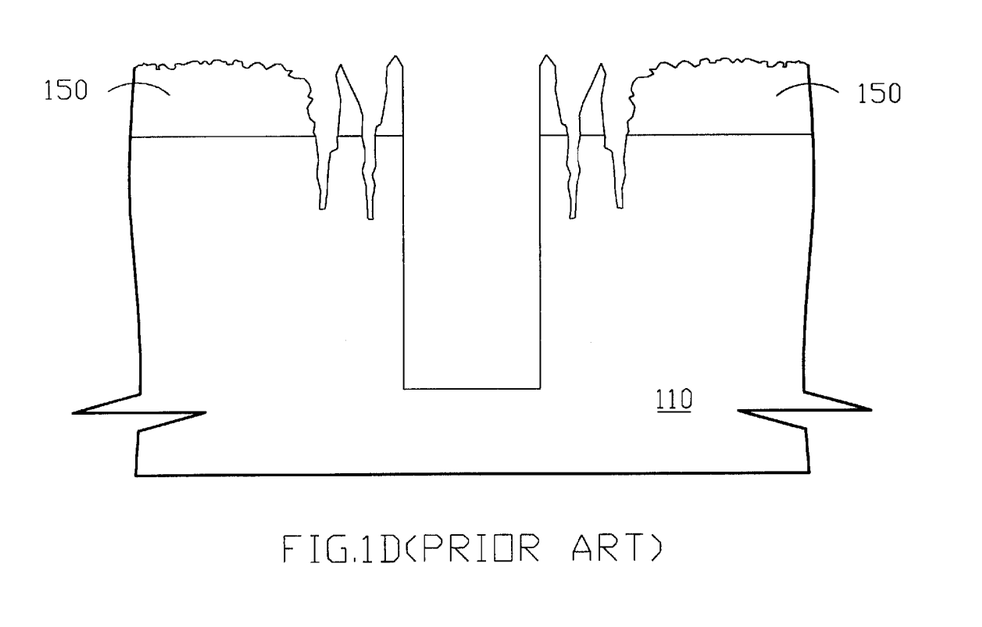
FIG. 1D shows cross-sectional views illustrative of the fences of the dielectric layer that is not enough in accordance with the conventional etching process for forming the trench.

In the conventional etching process, the etchant for etching the trench with a high aspect ratio usually uses two kinds of etching recipes that are $C_4F_8/O_2/Ar/CO$. Nevertheless, the etching process is terminated during the etching process when forming the trench with a high aspect ratio due to the above etchant with an etching capability that is not enough, so the deepness of the trench has yet to be achieved. This is, the "etching stop" effect, as shown in FIG. 1B. Especially, when the aspect ratio of the trench is more than 10, the etching stop effect will be more serious. Moreover, the traditional etchant has higher etching selectivity between different dielectric layers 110, such as oxide/nitride, so the process environment has to be changed to etch through the different dielectric layers 110, and hence, waste of process cycle time. On the other hand, the traditional etchant has lower etching selectivity to photoresist layer 150, so that the remainder of the photoresist layer 150 is not enough after the etching process. Hence, loss of the photoresist layer 150 causes the predetermined width of the trench to get out of control, so that the critical dimension of the trench can not be controlled, for example, maybe the predetermined width of the trench becomes more wider, as shown in FIG. 1C. Although the photoresist layer 150 will be lost during the etching process, still a portion of photoresist layer 150 will remain on the dielectric layer 110, this issue will always cause a fence of the dielectric layer 110 near the trench, as shown in FIG. 1D. For the dynamic random access memory (DRAM) with gates that are located on multi-levels, the contact windows and via holes with different aspect ratios are difficult to form by way of using an etching process with one time and traditional etchant. Conventional etching process makes the performance, quality and yield of the devices to worsen, and the process cycle time also increases, hence, additional cost. In accordance with the above description, a new and improved etching method for forming trench is therefore necessary so as to raise the yield and quality of the follow-up process.

SUMMARY OF THE INVENTION

In accordance with the present invention, a method is provided for forming a trench with a high aspect ratio that substantially overcomes the drawbacks of the above mentioned problems that arise from conventional methods.

Accordingly, it is a main object of the present invention to provide an etching process for forming a trench with a high aspect ratio. This invention can utilize the new etching recipe to perform an etching process one time, so as to form the contact windows and the via holes having different aspect ratios and simplify the process step to reduce the process cycle time. Furthermore, the etching capability of the etchant in this invention is very strong to prevent the etching stop effect, so as to form the semiconductor device with a small critical dimension. Therefore, this invention is appropriate for deep sub-micron technology.

Another object of the present invention is to provide a method for forming the contact windows and the via holes with different aspect ratios. The present invention can utilize a new etching recipe to raise the etching selectivity between the dielectric layer and the photoresist layer and reduce the etching selectivity between the dielectric layers from each other, so as to avoid losing the photoresist layer and punch through the dielectric layers at one time, whereby the critical dimension of the trench can be kept and the profile of the trench is more vertical, further, forming the fences of the dielectric can also be prevented. Moreover, the etchant of the present invention utilizes the mixing gas that comprises a $C_4F_6$ or $CH_2F_2$ or $CF_4$ or $C_2F_6$ to raise the etching selectivity between the dielectric layer and the photoresist layer to about 15 and reduce the etching selectivity between the dielectric layers from each other to about 1. Therefore, the present invention provides cost reduction, performance, quality and yield additions to the device. Hence, this invention corresponds to economic effect and utilization in industry.

In accordance with the present invention, a new etching process for forming a trench with high aspect ratio is disclosed. First of all, a semiconductor substrate is provided, the semiconductor substrate has a dielectric layer thereon. Then a photoresist layer is formed and defined on the dielectric layer. Next, an etching process is performed by the photoresist layer as an etched mask to form a trench in the dielectric layer, wherein the etchant of the etching process comprises a mixing gas with a $C_4F_6$ gas or a $CH_2F_2$ gas, such as $C_4F_6/CH_2F_2/Ar/O_2$ or $C_4F_6/CH_2F_2/Ar/O_2/CF_4$ or $C_4F_6/CH_2F_2/Ar/O_2/C_2F_6$, accordingly, the etching capability of the etchant and the etching selectivity between the dielectric layer and the photoresist layer can be raised. Finally, the photoresist layer is removed to form the contact window or the via hole with high accurate critical dimension.

BRIEF DESCRIPTION OF THE DRAWINGS

The foregoing aspects and many of the attendant advantages of his invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of embodiments besides those explicitly described, and the scope of the present invention is expressly not limited except as specified in the accompanying claims.

Figure 2A:
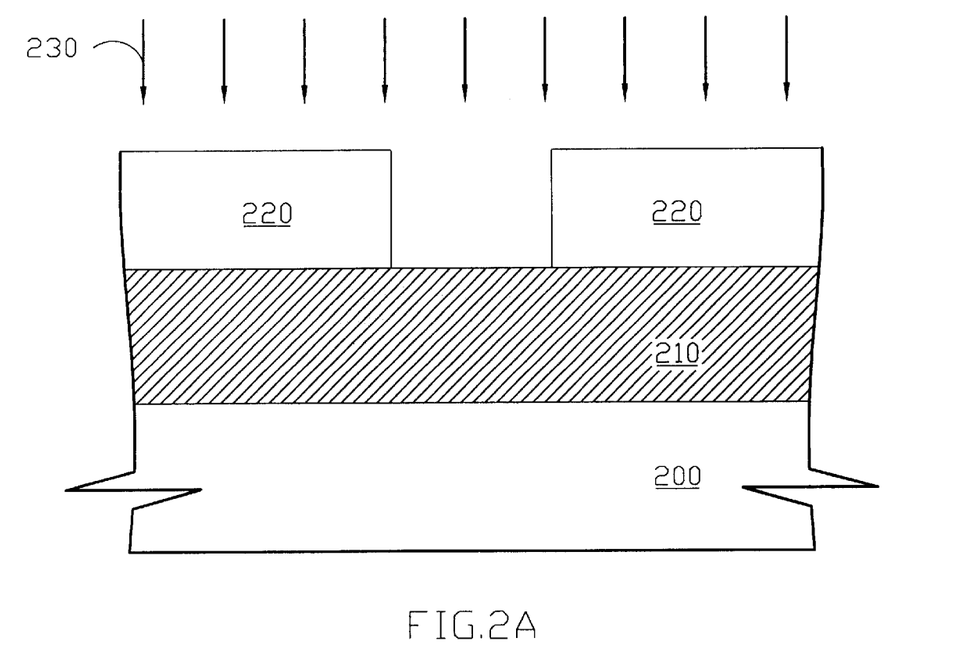
FIG. 2A and FIG. 2B show cross-sectional views illustrative of various stages for forming the trench by way of performing an etching process with a new etching recipe in accordance with the first embodiment of the present invention.
Figure 2B:
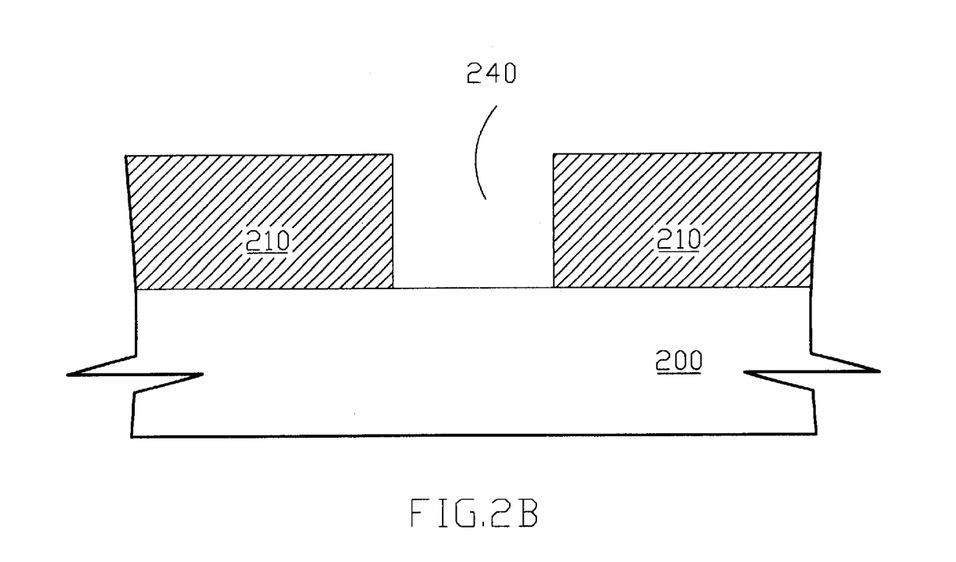

As illustrated in FIG. 2A and FIG. 2B, in the first embodiment of the present invention, a semiconductor substrate 200 is provided, and semiconductor substrate 200 has a dielectric layer 210 thereon. Then a photoresist layer 220 is formed and defined on the dielectric layer 210. Next, an etching process 230 is performed by the photoresist layer 220 as an etching mask to etch the dielectric layer 210 and form a trench 240 in the dielectric layer 210, wherein the etchant of the etching process 230 comprises a mixing gas with a $C_4F_6$ gas and/or a $CH_2F_2$ gas, accordingly, the etching capability of the etchant and the etching selectivity between the dielectric layer 210 and the photoresist layer 220 can be raised, so as to keep the profile of the photoresist layer 220 and avoid forming the fences of the dielectric layer 210 after finishing the etching process 230. Finally, the photoresist layer 220 is removed to form the trench 240 with vertical profile.

Figure 3A:
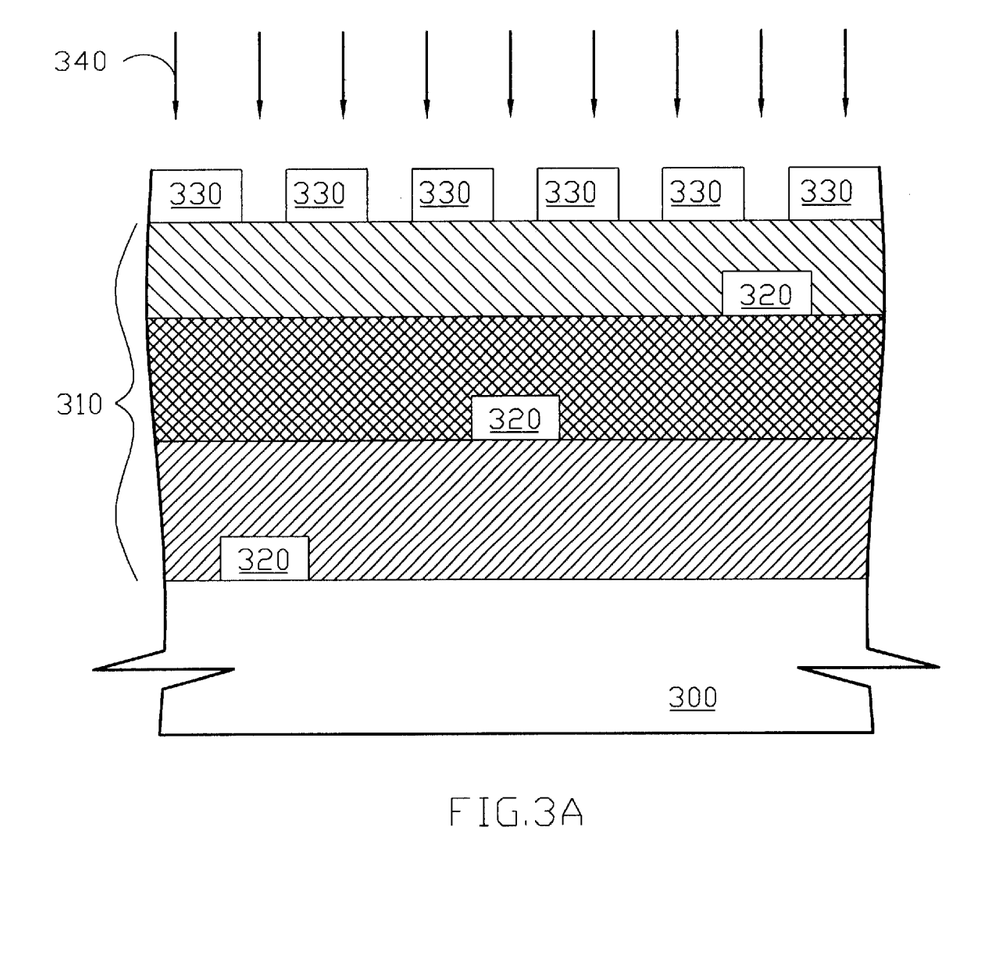
FIG. 3A and FIG. 3B show cross-sectional views illustrative of various stages for forming a plurality of trenches with the different aspect ratios by way of performing an etching process one time and a new etching recipe as an etchant in accordance with the second embodiment of the present invention.
Figure 3B:
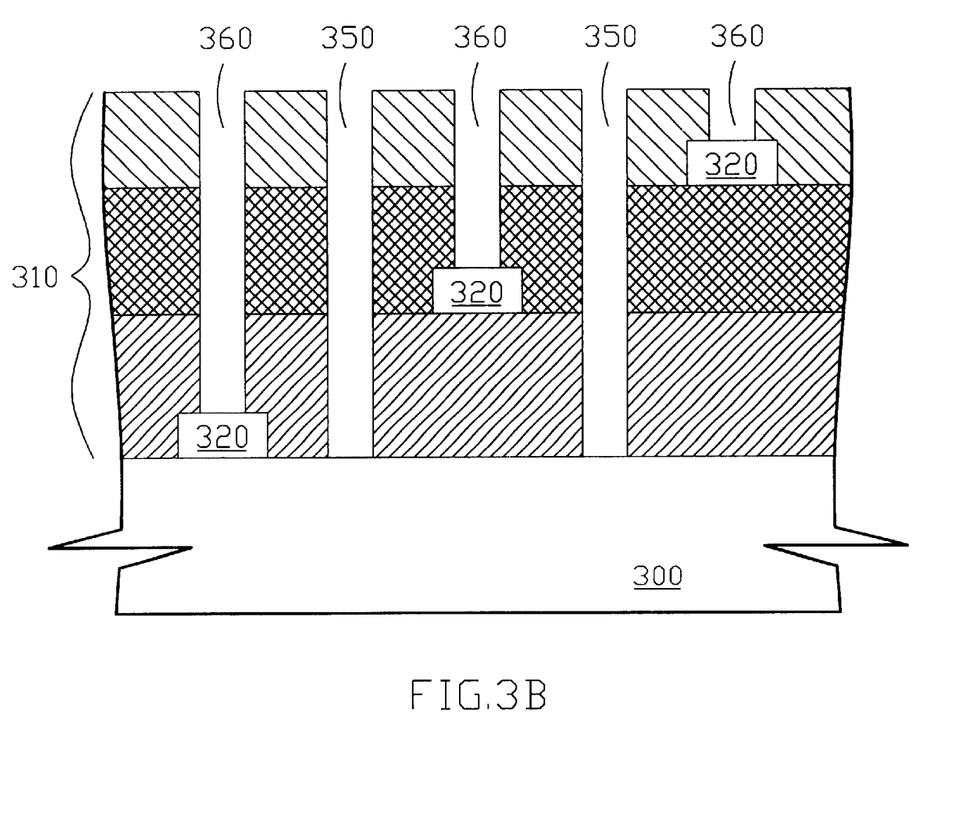

As illustrated in FIG. 3A and FIG. 3B, in the second embodiment of the present invention, a semiconductor substrate 300 is provided, and the semiconductor substrate 300 has a plurality of dielectric layers 310 with the stack structure thereon, and at least one polysilicon region 320 is embedded into each of the plurality of dielectric layers 310, wherein the plurality of dielectric layer 310 comprises an oxide layer and/or a nitride layer. Then a plurality of photoresist layers 330 are formed and defined on the surface of the plurality of dielectric layer 310, so as to define the predetermined regions for forming contact windows and the via holes. Next, a dry etching process 340 is performed by the plurality of photoresist layers 330 as a plurality of etching masks to etch the plurality of dielectric layers 310 until forming a plurality of via holes 350 on the semiconductor substrate 300 and a plurality of contact windows 360 on the plurality of polysilicon regions 320, wherein the etchant of the dry etching process 340 comprises a mixing gas with a $C_4F_6/CH_2F_2$ gas or a $C_4F_6/CH_2F_2/CF_4$ gas or a $C_4F_6/CH_2F_2/C_2F_6$ gas, accordingly, the etching selectivity between the plurality of dielectric layers 310 and the plurality of photoresist layers 330 can be raised, so as to keep the profile of the plurality of photoresist layers 330 and avoid the formation of fences of the plurality of dielectric layers 310 after finishing the etching process 340. Furthermore, the etching capability of the etchant can also be raised, and the etching selectivity between the plurality of dielectric layers 310, such as oxide and nitride layers, on the polysilicon regions 320 from each other can be reduced, so as to prevent the etching stop effect during the dry etching process 340 that can not etch through the different dielectric layers 310, so that the contact windows 360 are interrupted. Moreover, the plurality of via holes 350 comprises an aspect ratio that is more than about 10. Finally, the plurality of photoresist layers 330 are removed to form the plurality of via holes 350 and the plurality of contact windows 360 with the vertical profile.

Figure 4A:
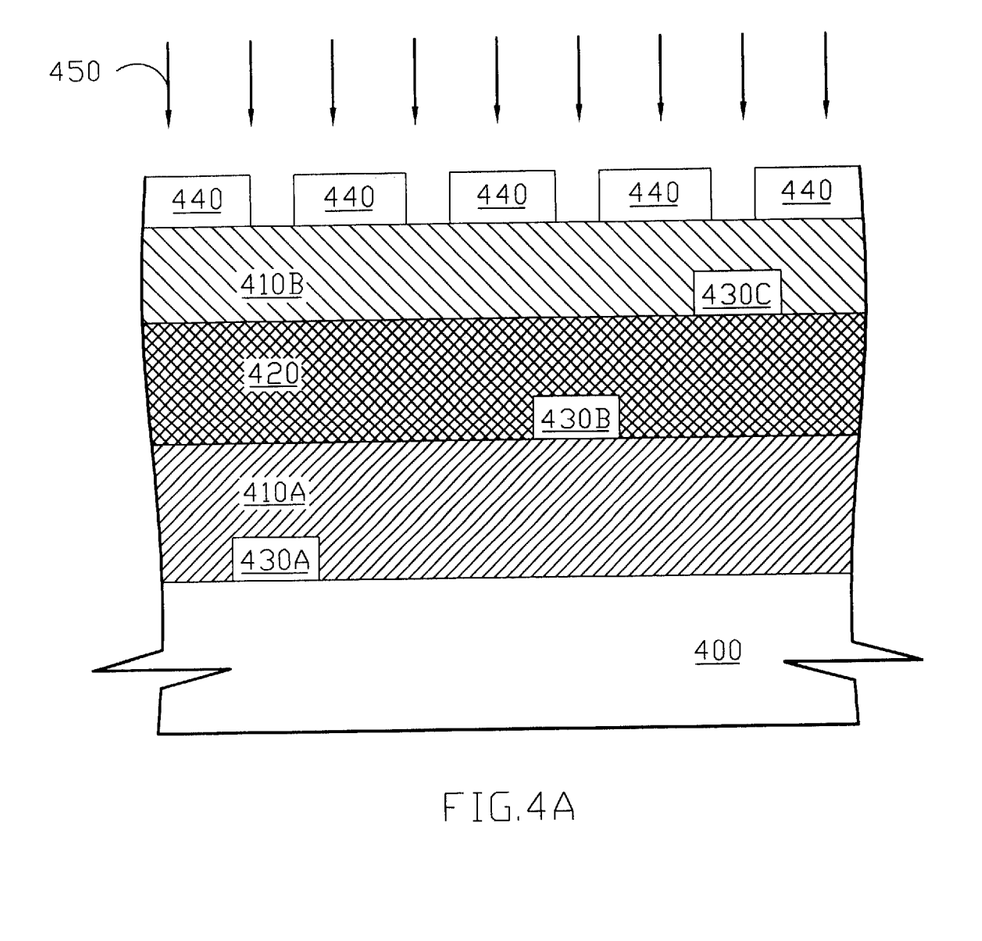
FIG. 4A and FIG. 4B show cross-sectional views illustrative of various stages for forming a plurality of contact windows and via holes with the different aspect ratios by way of performing an etching process one time and a new etching recipe as an etchant in accordance with the third embodiment of the present invention.
Figure 4B:
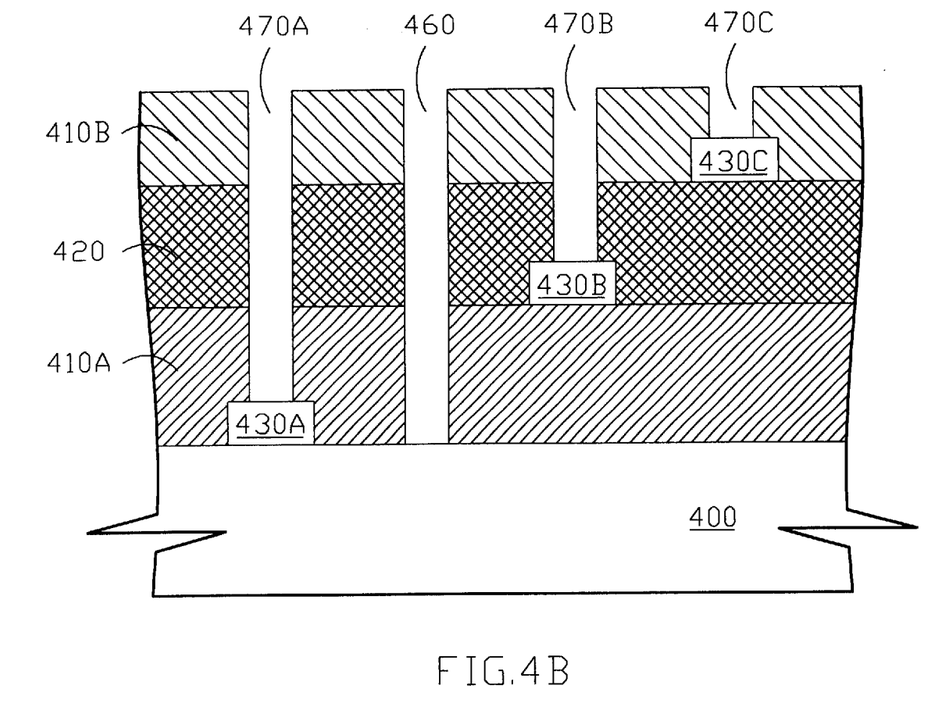

As illustrated in FIG. 4A and FIG. 4B, in the third embodiment of the present invention, first of all, a semiconductor substrate 400 is provided, wherein a first oxide layer 410A is formed on the semiconductor substrate 400, a nitride layer 420 is formed on the first oxide layer 410A, and a second oxide layer 410B is formed on the nitride layer, further, a first polysilicon region 430A is embedded in the first oxide layer 410A on the semiconductor substrate 400, a second polysilicon region 430B is embedded in the nitride layer 420 on the first oxide layer 410A, and a third polysilicon region 430C is embedded in the second oxide layer 410B on the nitride layer 420. Then forming and defining a plurality of photoresist layers 440 is on the second oxide layer 410B, so as to define the predetermined regions for forming the via holes and contact windows. A dry etching process 450 is then performed by the plurality of photoresist layers 440 as a plurality of etching masks to etch through in turn the second oxide layer 410B, the nitride layer 420 and the first oxide layer 410A until forming a via hole 460 on the semiconductor substrate 400 that is located between the first polysilicon region 430A and the second polysilicon region 430B, and that a first contact window 470A is formed on the first polysilicon region 430A, a second contact window 470B is formed on the second polysilicon region 430B, and a third contact window 470C is formed on the third polysilicon region 430C, wherein the etchant of the dry etching process 450 comprises a mixing gas with a $C_4F_6/CH_2F_2/Ar/O_2$ gas or a $C_4F_6/CH_2F_2/Ar/O_2/CF_4$ gas and/or a $C_4F_6/CH_2F_2/Ar/O_2/C_2F_6$ gas, accordingly, the etching selectivity between the second oxide layer 410B and the plurality of photoresist layers 440 can be increased to about 15, so as to keep the profile of the plurality of photoresist layers 440 and avoid fences from forming on the second oxide layer 410B after finishing the dry etching process 450. Furthermore, the etching capability of the etchant as above can also be strengthened, and the etching selectivity between the second oxide layer 410B, the nitride layer 420 and the first oxide layer 410A from each other can be decreased to about 1, so as to prevent the etching stop effect during the dry etching process 450. Therefore, the plurality of trenches with different aspect ratios are formed by way of performing the dry etching process 450 once. Moreover, the aspect ratio of the via hole 460 is more than about 10. Finally, the plurality of photoresist layers 440 are removed to form the via hole 460, the first contact window 470A, the second contact window 470B and the third contact window 470C with the vertical profile.

In these embodiments of the present invention, as discussed above, this invention can utilize the new etching recipe to perform an etching process once, so as to form the contact windows and the via holes having different aspect ratios and simplify the process step to reduce the process cycle time. Furthermore, the etching capability of the etchant in this invention is very strong to prevent the etching stop effect during the etching process, so as to form the semiconductor devices with small critical dimension. Therefore, this invention is appropriate for deep sub-micron technology. Furthermore, the present invention can utilize a new etching recipe to raise the etching selectivity between the dielectric layer and the photoresist layer and reduce the etching selectivity between the dielectric layers from each other, so as to avoid losing the photoresist layer and punch through the dielectric layers at one time, whereby the critical dimension of the trench can be kept and the profile of the trench is more vertical, further, forming the fences of the dielectric can also be prevented. Moreover, the etchant of the present invention utilizes the mixing gas that comprises a $C_4F_6$ or $CH_2F_2$ to raise the etching selectivity between the dielectric layer and the photoresist layer to about 15 and reduces the etching selectivity between the dielectric layers from each other to about 1. Therefore, the present invention makes cost reductions and performance, quality and yield additions of devices. Hence, this invention corresponds to economic effect and utilization in industry.

Of course, it is possible to apply the present invention to perform the etching process of the dynamic random access memory, and to any process for forming the trench in processing semiconductor devices. Also, this invention can be applied to avoid the etching stop effect by way of using the new etchant concerning the etching process with one time used for forming the trench with high aspect ratio has not been developed at present. The method of the present invention is the best etching process for forming the trench with high aspect ratio compatible process for deep sub-micro process.

Obviously, many modifications and variations of the present invention are possible in light of the above teachings. It is therefore to be understood that within the scope of the appended claims, that the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for forming a plurality of contact windows and a via hole of a dynamic random access memory, the method comprising:

providing a semiconductor substrate, a first oxide layer is formed on said semiconductor substrate, a nitride layer is formed on said first oxide layer and a second oxide layer is formed on said nitride layer, wherein a first polysilicon region is embedded in said first oxide layer on said semiconductor substrate, a second polysilicon region is embedded in said nitride layer on said first oxide layer, and a third polysilicon region is embedded in said second oxide layer on said nitride layer;

forming a patterned photoresist layer on the surface of said second oxide layer;

providing an etchant that is a mixing gas with a $C_4F_6/CH_2F_2/CF_4/Ar/O_2$ gas;

performing a dry etching process one time by way of using said patterned photoresist layer as an etching mask and said etchant to etch through in turn said second oxide layer, said nitride layer and said first oxide layer until forming a first trench with a aspect ratio on said semiconductor substrate that is located between said first polysilicon region and said second polysilicon region, and a second trench with a second aspect ratio is formed on said first polysilicon region, a third trench with a third aspect ratio is formed on the second polysilicon region, and a fourth trench with a fourth aspect ratio is formed on the third polysilicon region; and removing said photoresist layer to form a via hole with a vertical profile in said first trench, a first contact window with a vertical profile in said second trench, a second contact window with a vertical profile in said third trench and a third contact window with a vertical profile in said fourth trench.

2. The method according to claim 1, wherein said etchant comprises a mixing gas with a $C_4F_6/CH_2F_2/C_2F_6/Ar/O_2$ gas.

3. The method according to claim 1, wherein the etching selectivity between said plurality of photoresist layers and said second oxide layer is more than about 15.

4. The method according to claim 1, wherein the etching selectivity between said first oxide layer, said nitride layer and said second oxide layer from each other is more than about 1.

5. The method according to claim 1, wherein said first aspect ratio is more than about 10.

6. The method according to claim 1, wherein said first aspect ratio is more than said second aspect ratio.

7. The method according to claim 1, wherein said second aspect ratio is more than said third aspect ratio.

8. The method according to claim 1, wherein said third aspect ratio is more than said fourth aspect ratio.

\* \* \* \* \*